Figure 1:
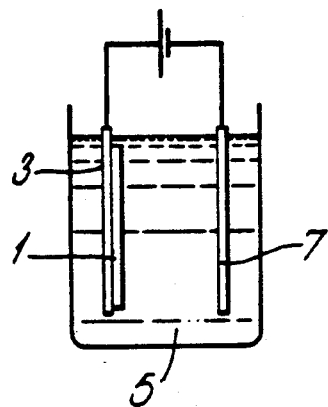

United States Patent [19]

Peterson et al.

[11] Patent Number: 4,761,211
[45] Date of Patent: Aug. 2, 1988

[54] METHOD OF IMPROVING THE ELECTRICAL CHARACTERISTICS OF A THIN FILM

[75] Inventors: Ian R. Peterson; Ian R. Girling, both of Middlesex, England

[73] Assignee: The General Electric Company, p.l.c., England

[21] Appl. No.: 124,109

[22] PCT Filed: Dec. 17, 1986

[86] PCT No.: PCT/GB86/00770
§ 371 Date: Aug. 10, 1987
§ 102(e) Date: Aug. 10, 1987

[87] PCT Pub. No.: WO87/04007
PCT Pub. Date: Jul. 2, 1987

[30] Foreign Application Priority Data

Dec. 20, 1985 [GB] United Kingdom ............... 8531445

[51] Int. Cl.$^4$ ............................................. C25F 5/00
[52] U.S. Cl. ................................... 204/130; 204/56.1
[58] Field of Search ........................... 204/130, 56.1

[56] References Cited

U.S. PATENT DOCUMENTS 4,087,582  5/1978  Shirahata et al. ................. 428/336
4,514,254  4/1985  Klepner ............................. 156/656

OTHER PUBLICATIONS

"New Technique for Pinhole Detection . . . ", by Kokkotakis et al. Extended Abstracts, J. Electrochem. Soc., vol. 80-1, 1980, pp. 141-143.

Primary Examiner—R. L. Andrews
Attorney, Agent, or Firm—Kirschstein, Kirschstein, Ottinger & Israel

[57] ABSTRACT

A method of improving the electrical characteristics of a thin film (1 or 9) formed on a substrate (3 or 11) by a Langmuir-Blodgett process. The method comprises immersing the film (1 or 9) in a fluid (5 or 13) and applying an electrical potential to the substrate (1 or 9) such that a self limiting electrochemical reaction within the fluid (5 or 13) causes any voids in the film (1 or 9) to be preferentially filled.

7 Claims, 1 Drawing Sheet

METHOD OF IMPROVING THE ELECTRICAL CHARACTERISTICS OF A THIN FILM

This invention relates to thin films. By "thin film" is meant a layer of approximately monomolecular thickness. In particular the invention relates to methods of improving the electrical characteristics of thin films formed on an electrically conductive substrate.

In recent years there has been a great deal of interest in the electrical characteristics of thin films of thicknesses in the order to nanometers formed on electrically conductive substrates, these films being either of insulating or semiconducting materials. As such thin insulating films can support extremely high electric fields, they find application in, for example, capacitor microphones whilst such thin semiconductor films find application in electroluminescent displays.

Such thin films suffer the disadvantage however that defects in the form of voids are frequently present in the films, such voids resulting in electrical short circuits. This is particularly the case where the thin films are formed on the substrate by means of, for example, vacuum evaporation, plasma deposition or spin coating. Furthermore whilst it has previously been thought that thin films formed by the Langmuir-Blodgett technique are defect free recent evidence has shown that this is not the case.

It is an object of the present invention to provide a method of improving the electrical characteristics of thin films formed on electrically conductive substrate.

According to the present invention a method of improving the electrical characteristics of a thin film formed on an electrically conductive substrate comprises immersing the film in a fluid and applying an electrical potential to the substrate such that a self limiting electrochemical reaction within the fluid causes any voids in the film to be preferentially filled.

The film is suitably formed on the substrate by a Langmuir-Blodgett process.

In one particular method in accordance with the invention the fluid is an aqueous liquid, and the potential causes the substrate under the voids to become anodised.

In another particular method in accordance with the invention, the fluid is an electrolyte, and the potential causes the voids to be filled by the product of the electrochemical reduction or oxidation of a substance present within the electrolyte.

Two methods of improving the electrical characteristics of thin films formed on an electrically conductive substrate will now be described by way of examples only, with reference to the accompanying figures which are respective illustrations of the methods in operation.

Referring firstly to FIG. 1 the first method to be described is designed to improve the insulating properties of a monolayer organic film 1 previously desposited on an aluminium substrate 3 using a Langmuir-Blodgett technique as described, for example, in the review article written by the inventors "Langmuir-Blodgett films" in Sci. Prog. Oxf. (1985) volume 69, pages 533–550. To reduce the number of voids in the film 1, the substrate 3 carrying the film 1 is immersed in an aqueous medium 5 such as diammonium hydrogen citrate solution and a positive potential applied to the substrate with respect to the potential of a negative electrode 7 within the aqueous medium 5. In the regions of the aluminium substrate 3 under any voids in the film anodisation of the aluminium will take place, whilst the remaining regions of the substrate 3 will be protected from the aqueous medium 5 by the overlying film 1. Thus the regions of the substrate 3 lying under the voids will be converted to a material which is less electrically conductive than aluminium, this process being self limiting in that the less conductive material will prevent further anodisation of the underlying substrate taking place, ultimately all the voids being sealed off.

It will be appreciate that many other substrate materials may similarly be anodised to a less conductive material to perform the required void sealing, examples of such other substrate matrials being silicon, germanium, iridium, titanium and tantalum.

Figure 2:
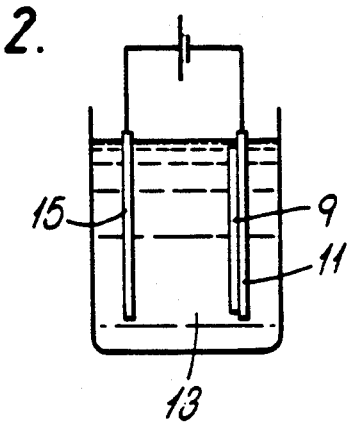

Referring now to FIG. 2, the second method to be described is designed to improve the insulating properties of a monolayer organic film 9 deposited on a conductive substrate 11 again using a Langmuir-Blodgett technique. In this second method the substrate 11 carrying the film 9 is immersed in an electrolyte 13 containing thallium (I) hydroxide, and a negative potential applied to the substrate with respect to the potential of a positive electrode 15 within the electrolyte 13. These potentials cause the thallium (I) hydroxide to be oxidised to thallium (III) oxide, this substance being an insoluble insulator, the thallium oxide ions being drawn to the substrate 11 so as to selectively fill the voids within the film 9, this process being self limiting as in similar fashion to the first method to be described.

It will be appreciated that in the second method a wide range of substances within the electrolyte may be used which on oxidation take an insoluble, insulating form, for example sulphides which on oxidation become sulphur. Furthermore a wide class of aromatic organic materials such as thiophene and pyrrole which are anodically polymerised to a conducting material which can then be rendered insulating by altering the polarities of the substrate and electrode, may be used.

It will also be appreciated that the second method to be described may rely on the reduction rather than the oxidation of a substance within the electrolyte to a less conductive state, a positive potential then being applied to the substrate with respect to the potential of the electrode. Suitable materials for such an electrochemical reduction process include mercury (II) chloride which would reduce to mercury (I) chloride, platinum (IV) chloride which would reduce to platinum (II) chloride, lead ferricyanide which would reduce to lead ferrocyanide, and copper (II) chloride which would reduce to copper (I) chloride.

It will also be appreciated that whilst the two methods described herebefore by way of example relate to the improvement of the electrical properties of a thin film formed on a conductive substrate using a Langmuir-Blodgett technique, and that the invention finds particular application to such films, the invention is also applicable to thin films formed by other methods.

We claim:

1. A method of improving the electrical characteristics of a thin film formed on an electrically conductive substrate comprising: forming the film on the substrate by a Langmuir-Blodgett process; immersing the film in a fluid; and applying an electrical potential to the substrate such that a self-limiting electrochemical reaction within the fluid causes any voids in the film to be preferentially filled.

2. A method according to claim 1, in which the fluid is an aqueous liquid and the potential applying step causes the substrate under the voids to become anodized.

3. A method according to claim 2, in which the liquid is a diammonium hydrogen citrate solution.

4. A method according to claim 1, in which the fluid is an electrolyte, and the potential applying step causes the voids to be filled by the product of the electrochemical reduction or oxidation of a substance present within the electrolyte.

5. A method according to claim 4, in which the electrolyte contains thallium (I) hydroxide.

6. A method according to claim 4, in which the electrolyte contains a sulphide.

7. A method according to claim 4, in which the electrolyte contains an aromatic organic material which may be anodically polymerized to a conducting material which may then be rendered insulating cathodically.

* * * * *